(12) United States Patent
Jung et al.

(10) Patent No.: US 9,595,691 B2
(45) Date of Patent: Mar. 14, 2017

(54) ORGANIC LIGHT EMITTING DIODE DEVICE

(71) Applicant: LG DISPLAY CO., LTD., Seoul (KR)

(72) Inventors: Sang Chul Jung, Paju-si (KR); Hang Sup Cho, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/047,281

(22) Filed: Feb. 18, 2016

(65) Prior Publication Data

US 2016/0164036 A1 Jun. 9, 2016

Related U.S. Application Data

(62) Division of application No. 14/297,338, filed on Jun. 5, 2014, now Pat. No. 9,299,952.

(30) Foreign Application Priority Data

Jun. 28, 2013 (KR) .................. 10-2013-0075306

(51) Int. Cl.
| | |
|---|---|
| H01L 51/52 | (2006.01) |
| H01L 27/32 | (2006.01) |
| H01L 51/00 | (2006.01) |

(52) U.S. Cl.
CPC ...... *H01L 51/5262* (2013.01); *H01L 27/3276* (2013.01); *H01L 51/0097* (2013.01); *H01L 51/5203* (2013.01); *H01L 51/5237* (2013.01); *H01L 51/5246* (2013.01); *H01L 51/5253* (2013.01); *H01L 51/524* (2013.01); *H01L 2251/5338* (2013.01); *H01L 2251/558* (2013.01)

(58) Field of Classification Search
CPC ............. H01L 51/5008; H01L 51/5253; H01L 51/5265
See application file for complete search history.

(56) References Cited

U.S. PATENT DOCUMENTS

| | | | |
|---|---|---|---|
| 2009/0057672 A1* | 3/2009 | Kobayashi | .............. H01L 29/04 257/59 |
| 2009/0261716 A1* | 10/2009 | Choi | ................... H01L 27/3211 313/504 |
| 2011/0097550 A1 | 4/2011 | Matusovsky et al. | |
| 2012/0171804 A1 | 7/2012 | Moslehi et al. | |
| 2012/0208306 A1 | 8/2012 | Haas et al. | |
| 2014/0117316 A1 | 5/2014 | Choi | |

* cited by examiner

*Primary Examiner* — Thomas L Dickey
(74) *Attorney, Agent, or Firm* — Dentons US LLP

(57) ABSTRACT

Disclosed is an organic light emitting diode device fabrication method that includes: preparing a substrate which is defined into a display area and a non-display area; forming a light emission portion, which includes a thin film transistor and an organic light emission layer in the display area, and a pad portion in a part of the non-display area; sequentially forming a sacrificial layer and an encapsulation passivation film throughout the display and non-display areas; and separating the sacrificial layer and the encapsulation passivation film from the pad portion through an irradiation of laser light.

14 Claims, 8 Drawing Sheets

ORGANIC LIGHT EMITTING DIODE DEVICE

This application is a Divisional of U.S. application Ser. No. 14/297,338 filed Jun. 5, 2014, now allowed, which claims priority under 35 U.S.C. §119(a) to Korean Patent Application No. 10-2013-0075306 filed on Jun. 28, 2013, both of which are hereby incorporated by reference in their entirety for all purposes as if fully set forth herein.

BACKGROUND OF THIS INVENTION

Field of the Invention

The present invention relates to an organic light emitting diode device. More particularly, the present invention relates to an organic light emitting diode device fabrication method adapted to secure design competitiveness by realizing a narrow bezel, and to an organic light emitting diode device fabricated thereby.

Discussion of the Related Art

An organic light emitting diode device is called as an organic light emitting display (OLED) device. The organic light emitting diode device emits light by forming excitons through re-combination of electrons and electric-holes, which are injected from an electron injection electrode and an electric-hole injection electrode into an organic light emission layer, and transitioning the excitons from an excited state to a ground state.

As such, the organic light emitting diode device has a self-luminous property. In other words, the organic light emitting diode device does not require any separate light source, unlike a liquid crystal display device. In accordance therewith, the organic light emitting diode device can reduce thickness and weight. Also, the organic light emitting diode device has superior features such as low power consumption, high brightness, and high-speed response. Therefore, the organic light emitting diode device attracts public attention as a next generation display device of mobile appliances. Moreover, a procedure of fabricating the organic light emitting diode device is simple. As such, fabricating cost of the organic light emitting diode device is largely reduced in comparison to that of existing liquid crystal display devices.

FIG. 1A is a perspective view showing a related art organic light emitting diode device. FIG. 1B is a cross-sectional view showing the organic light emitting diode device taken along line I-I' in FIG. 1A.

Referring to FIGS. 1A and 1B, the related art organic light emitting diode device includes a first substrate 20, on which a light emission portion 40 is formed, and a second substrate (not shown) facing the first substrate 20. The first substrate 20 and the second substrate are combined with each other by a sealing member.

In detail, the first substrate 20 is includes a display area AA and a non-display area NA. The display area AA is used for displaying images. The non-display area NA occupies the rest of the first substrate 20 except the display area AA. A part of the non-display area NA is defined as a pad area PA.

The light emission portion 40 is formed on the display area AA. If the organic light emitting diode device is in an active matrix mode, pluralities of gate lines GL and data lines DL crossing each other are formed within the light emission portion 40. Also, a plurality of pixels is defined within the light emission portion by the pluralities of gate lines GL and data lines DL. Thin film transistors are formed at crossings of the gate lines GL and the data lines DL. Each thin film transistor is connected to a first electrode 31 which is formed within the respective pixel. An organic light emission layer 33 and a second electrode 34 are sequentially formed on the first electrode 31. In general, the first electrode 31 is used as an anode and the second electrode 34 is used as a cathode. When the second electrode 34 is formed, the light emission portion 40 is completed.

Meanwhile, a pad portion 30 is formed in the pad area PA of the non-display area NA. The pad portion 30 is connected to the gate and data lines GL and DL of the display area AA. Such a pad portion 30 connects the gate and data lines GL and DL to an external printed circuit board (not shown) which is used as a driving circuit substrate.

However, the organic light emitting diode device has a property very vulnerable to moisture and oxygen within an atmosphere. As such, the organic light emitting diode device must be encapsulated in order to prevent the intrusion of moisture and oxygen. As such, it is necessary for the organic light emitting diode device to perform an encapsulation process.

FIG. 2 is a cross-sectional view illustrating a method of fabricating an organic light emitting diode device according to the related art. In detail, FIG. 2 is a cross-sectional view illustrating a method of forming an encapsulation passivation film which is used to prevent the intrusion of moisture and oxygen.

Referring to FIG. 2, the related fabrication method of the organic light emitting diode device includes: preparing the first substrate 20 defined into the display area AA and the non-display area NA; forming the light emission portion 40 on the display area AA; forming the pad portion 30 on the pad area PA of the non-display area NA; forming an encapsulation passivation film 60 on the entire area of the first substrate 20 except the pad portion 30; and combining the first substrate 20, on which the encapsulation passivation film 60 is formed, with the second substrate (not shown).

More specifically, the formation of the encapsulation passivation film 60 includes depositing several organic and inorganic materials on the second electrode 34 of the light emission portion 40 which is used as the cathode. At this time, the encapsulation passivation film 60 is formed in such a manner as to sufficiently cover the display area AA provided with the light emission portion 40. However, the encapsulation passivation film 60 must not be formed on the pad area PA provided with the pad portion 30 which will come in contact with a driver IC (Integrated Circuit) chip and a FPC (Flexible Printed Circuit) film.

As described above, the organic light emitting diode device is vulnerable to moisture. Due to this, it is difficult to perform a wet etching process after the formation of the light emission portion 40. Therefore, a mask 1 is used to prevent the deposition of the encapsulation passivation film 60 in the pad area PA at the formation of the encapsulation passivation film 60.

The use of the mask 1 can cause many problems. For example, a fault can be caused by curling of the mask 1 or misaligning of the mask 1, quality of a formed film can deteriorate by foreign substance on the mask 1, an arc discharge can be generated in a chamber due to the mask 1, properties of a deposited film can become different by material quality of the mask 1, and static electricity can be generated due to the mask 1. Moreover, the use of the mask 1 can generate a shadow region in a deposited film and force a process margin to be reduced.

The above-mentioned problems become factors that deteriorate a yield rate of the organic light emitting diode devices. Also, the mask 1 requires an expensive fine alignment system. As such, many costs additionally needed to manufacture and maintain the expensive equipment. Moreover, the fine alignment process forces not only tact time to increase but also productivity of the organic light emitting diode devices to deteriorate. Furthermore, it is difficult for a narrow bezel to design a panel because the shadow region is generation in the deposited film.

SUMMARY OF THE INVENTION

Accordingly, the present invention is directed to an organic light emitting diode device fabrication method and an organic light emitting diode device fabricated thereby.

A method of fabricating an organic light emitting diode device may include: forming a light emission portion in a display area of a substrate; forming a pad portion in a non-display area of the substrate; forming a sacrificial layer over the light emission portion and the pad portion; forming an encapsulation passivation film over the sacrificial layer; and removing the sacrificial layer and the encapsulation passivation film from the pad portion by means of irradiation of laser light.

In embodiment, an organic light emitting diode device includes: a substrate comprising a display area and a non-display area; a light emission portion formed in the display area of the substrate; a pad portion formed in the non-display area of the substrate; and a sacrificial layer formed over the light emission portion; and an encapsulation passivation film formed over the sacrificial layer; wherein the pad portion is free from the sacrificial layer and the encapsulation passivation film.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with the embodiments. It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the embodiments and are incorporated herein and constitute a part of this application, illustrate embodiment(s) of the present disclosure and together with the description serve to explain the disclosure. In the drawings.

DETAILED DESCRIPTION OF THE ILLUSTRATED EMBODIMENTS

Figure 1A:
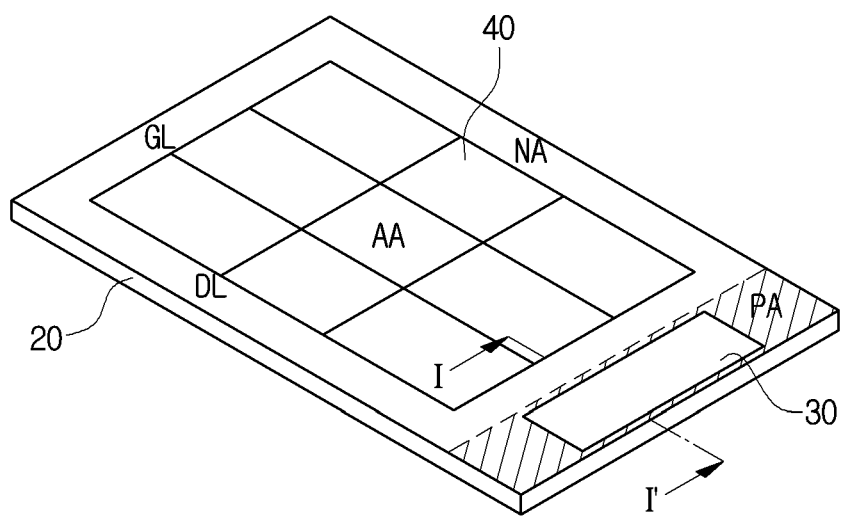
FIG. 1A is a perspective view showing a related art organic light emitting diode device.
Figure 1B:
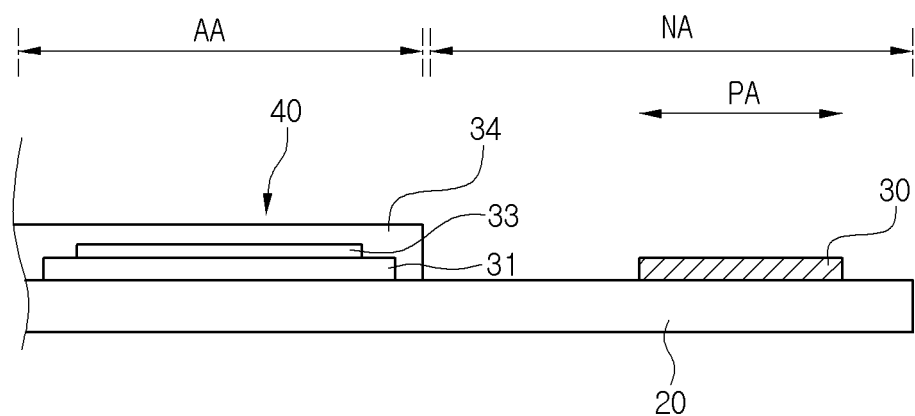
FIG. 1B is a cross-sectional view showing the organic light emitting diode device taken a line I-I' in FIG. 1A.
Figure 2:
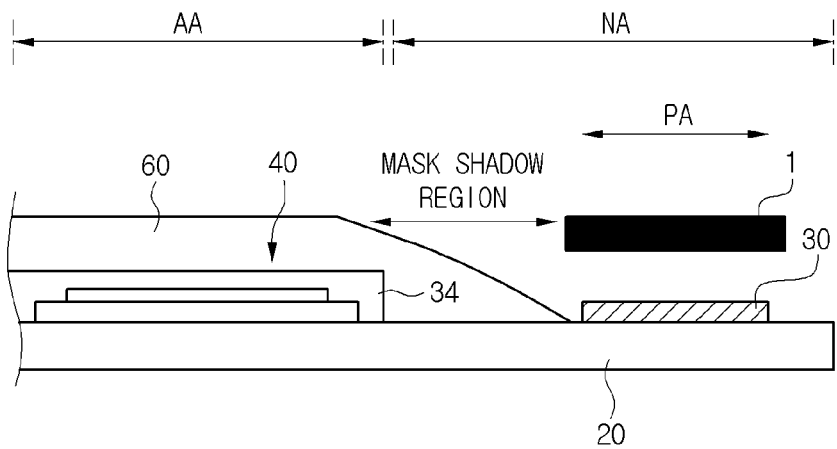
FIG. 2 is a cross-sectional view illustrating a method of fabricating an organic light emitting diode device according to the related art.

Reference will now be made in detail to an organic light emitting diode device fabrication method and an organic light emitting diode device fabricated thereby in accordance with embodiments of the present disclosure, examples of which are illustrated in the accompanying drawings. These embodiments introduced hereinafter are provided as examples in order to convey their spirits to the ordinary skilled person in the art. Therefore, these embodiments might be embodied in a different shape, so are not limited to these embodiments described here. In the drawings, the size, thickness and so on of a device can be exaggerated for convenience of explanation. Wherever possible, the same reference numbers will be used throughout this disclosure including the drawings to refer to the same or like parts.

FIGS. 3A through 3H are cross-sectional views illustrating, step-by-step, a method of fabricating an organic light emitting diode device according to an embodiment of the present invention. In other words, the cross-sectional views of FIGS. 3A through 3H largely show a part of a display area AA and a pad area PA of a non-display area NA in order to illustrate in detail a method of fabricating an organic light emitting diode device according to an embodiment of the present disclosure. Specifically, the non-display area NA comprises a first non-display area portion NA1 and a second non-display area portion NA2. The first non-display area portion NA1 is arranged directly adjacent to the display area AA and the second non-display area portion NA2 is arranged at a distance d from the display area AA, wherein the first non-display area portion NA1 is arranged between the display area AA and the second non-display area portion NA2. The distance d between the nearest edge of the second non-display area portion NA2 and the nearest edge of the display area AA may be in the range from a few cm or a few mm, e.g. in the range from about 5 mm to about 5 cm. The pad area PA is formed in the second non-display area portion NA2.

Figure 3A:
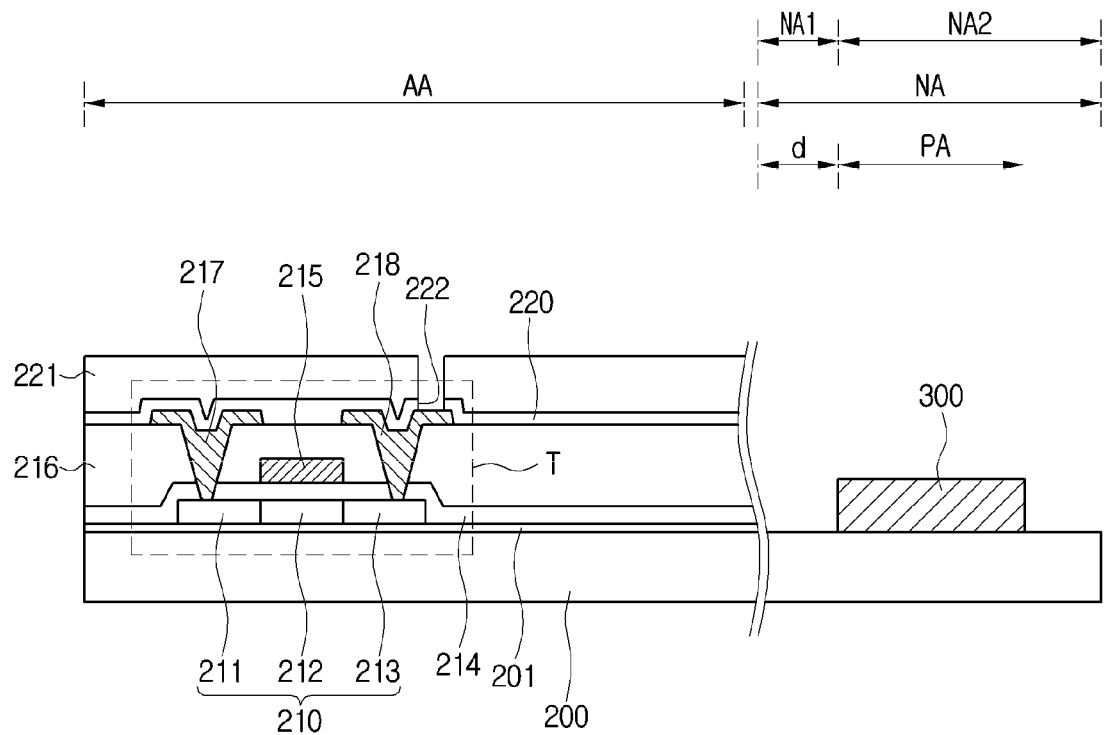
FIGS. 3A through 3H are cross-sectional views illustrating step by step a method of fabricating an organic light emitting diode device according to an embodiment of the present disclosure.

Referring to FIG. 3A, a buffer layer 201 is formed on the entire surface of a first substrate 200 which is defined to include a display area AA and a non-display area NA.

The first substrate 200 can be formed from one material selected from a material group which includes glass, plastic, polymer and so on, but it is not limited to this. If the first substrate 200 is a flexible substrate which attracts public attention, the first substrate 200 can be formed from any one selected from a material group which includes polyethylenenaphthalate (PEN), polyethyleneterephthalate (PET), polycarbonate (PC), polyethersulfone (PES), transparent polyimide (PI), polyarylate (PAR), polycyclic olefin (PCO), poly methyl methacrylate (PMMA), crosslinking type epoxy, crosslinking type urethane and so on.

The buffer layer 201 prevents the diffusion of impurities of the first substrate 200 at the formation of an active layer 210 or an organic light emission layer 233 (in FIG. 3D) which will be formed later. The buffer layer 201 can be formed in a single layer of silicon nitride or a stacked layer structure of a silicon nitride layer and a silicon oxide layer, as an example. However, the buffer layer 201 can be removed from the first substrate 200 as needed.

A transistor, e.g. a thin film transistor T is formed on the buffer layer 201 within the display area AA. The transistor, e.g. the thin film transistor T includes an active layer 210, a source electrode 217, a drain electrode 218 and a gate electrode 215 which are formed above the buffer layer 201. The active layer 210 includes a source region 211, a drain region 213 and a channel region 212. The channel region 212 is disposed between the source and drain regions 211 and 213. In other words, the channel region 212 connects the source and drain regions 211 and 213 to each other.

Subsequently, a gate insulation film 214 covering the active layer 210 is formed on the entire surface of the first substrate 200 which includes the display area AA and the non-display area NA. Also, the gate electrode 215 is formed on the gate insulation film 214 opposite to the active layer 210 within the display area AA. The gate electrode 215 can be formed from a metal material. For example, the gate electrode 215 can be formed from any one selected from a metal group which includes MoW, Al, Cr and Al/Cr. Thereafter, an interlayer insulation film 216 covering the gate electrode 215 is formed on the entire surface of the first substrate 200 including the display area AA and the non-display area NA.

Primary contact holes penetrating through the interlayer insulation film 216 and the gate insulation film 214 are formed. The primary contact holes expose the source and drain regions 211 and 213 of the active layer 210. The source electrode 217 and the drain electrode 218 are formed on the interlayer insulation film in such a manner as to be electrically connected to the exposed source and drain regions 211 and 213 via the primary contact holes, respectively. The source electrode 217 and the drain electrode 218 can be formed from a metal material. For example, the source electrode 217 and the drain electrode 218 can be formed from one of Ti/Al and Ti/Al/Ti.

Although it is explained that the thin film transistor is formed in a coplanar structure, the present disclosure is not limited to this. In other words, the thin film transistor can be formed in every structure which is known up to the present. For example, the thin film transistor can be formed in any one of an inverted coplanar structure, a staggered structure, an inverted staggered structure and equivalent structures thereto.

Meanwhile, pads (not shown) of the same material as the source and drain electrodes 217 and 218 are formed on the interlayer insulation film 216 corresponding to the pad area PA. The pads form a pad portion 300. In another way, the pads can be simultaneously formed from the same material as the gate electrode 215 when the gate electrode 215 is formed.

The pad portion 300 is connected to the gate and data lines GL and DL of the display area AA. Also, the pad portion 300 connects the gate and data lines GL and DL with an external driver circuit board (not shown) corresponding to a printed circuit board.

After the thin film transistor T is completed, a passivation film 220 and a planarization film 221 are sequentially formed on the entire surface of the first substrate 200 including the display area AA and the non-display area NA. A secondary contact hole 222 penetrating through the planarization film 221 and the passivation film 220 and exposing the drain electrode 218 is formed.

Figure 3B:
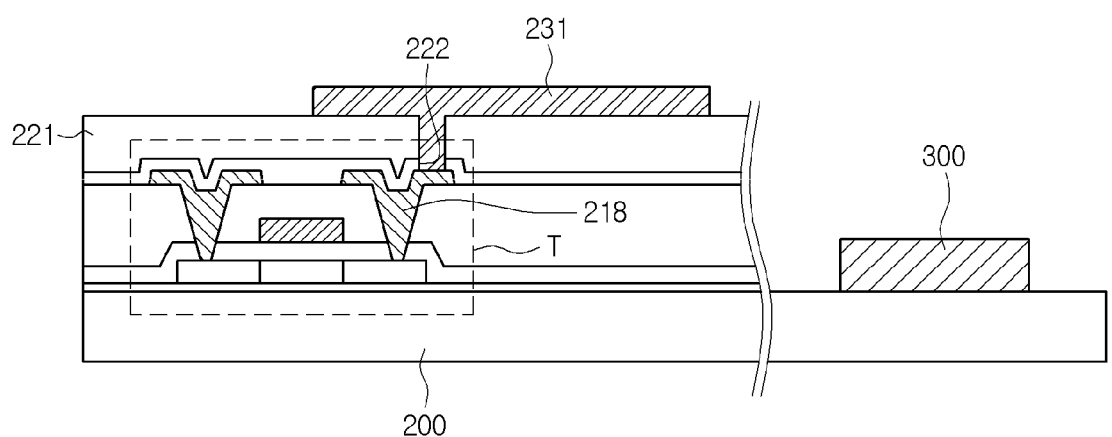

As shown in FIG. 3B, a first electrode 231 is formed on the planarization film 221 within the display area AA. The first electrode 231 is electrically connected to the drain electrode 218 of the thin film transistor T through the secondary contact hole 222.

If the first electrode 231 is used as an anode, the first electrode 231 can be formed from any one selected from a material group which includes ITO (indium-tin-oxide), ITO/Ag, ITO/Ag/ITO, ITO/Ag/IZO (indium-zinc-oxide) and so on. However, the first electrode 231 of the present disclosure is not limited to the above-mentioned materials. The ITO (indium-tin-oxide) film can become a transparent conductive thin film which is used for injecting electric holes into an organic light emission layer 233 (shown in FIG. 3D).

Figure 3C:
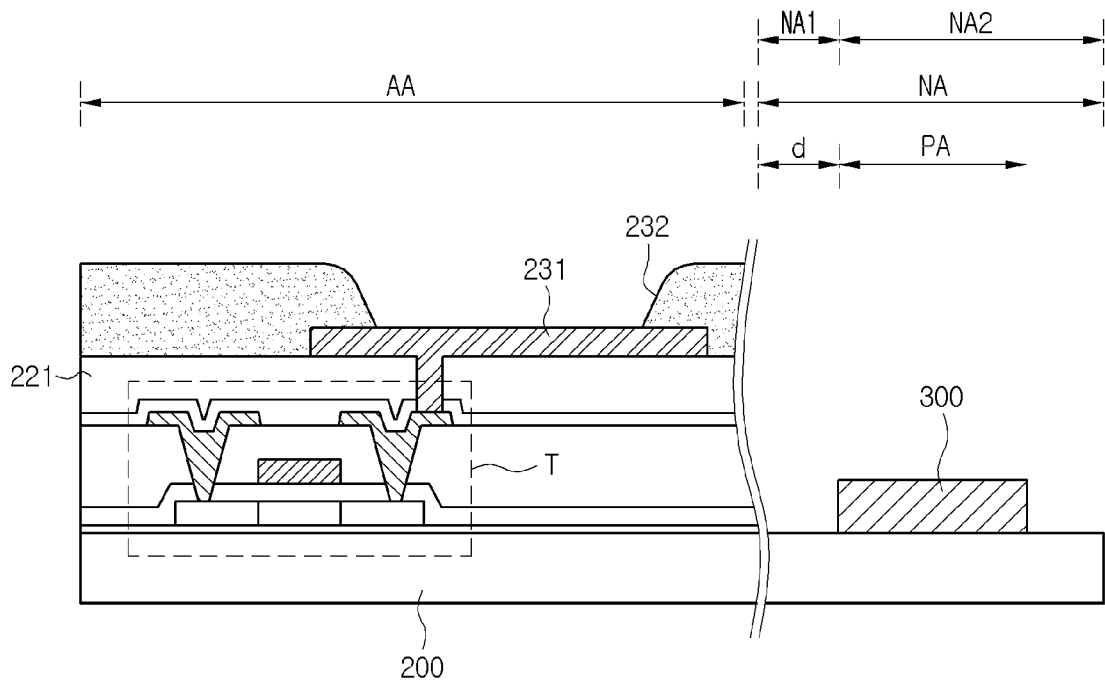

Referring to FIG. 3C, an organic bank film 232 defining pixels is formed after the first electrode 231 is formed on the planarization film 221 within the display area AA. The organic bank film 232 defines the boundary between red, green and blue pixels and allows light emission boundary domains between the pixels to be definite. Also, the organic bank film 232 electrically isolates the first electrodes 231 of adjacent pixels from each other. Such an organic bank film 232 can be from polyimide (PI) or others, but it is not limited to this. An opening exposing a part of the first electrode 231 is formed in the organic bank film 232, e.g. by means of photolithography and etching, e.g. dry etching.

Figure 3D:
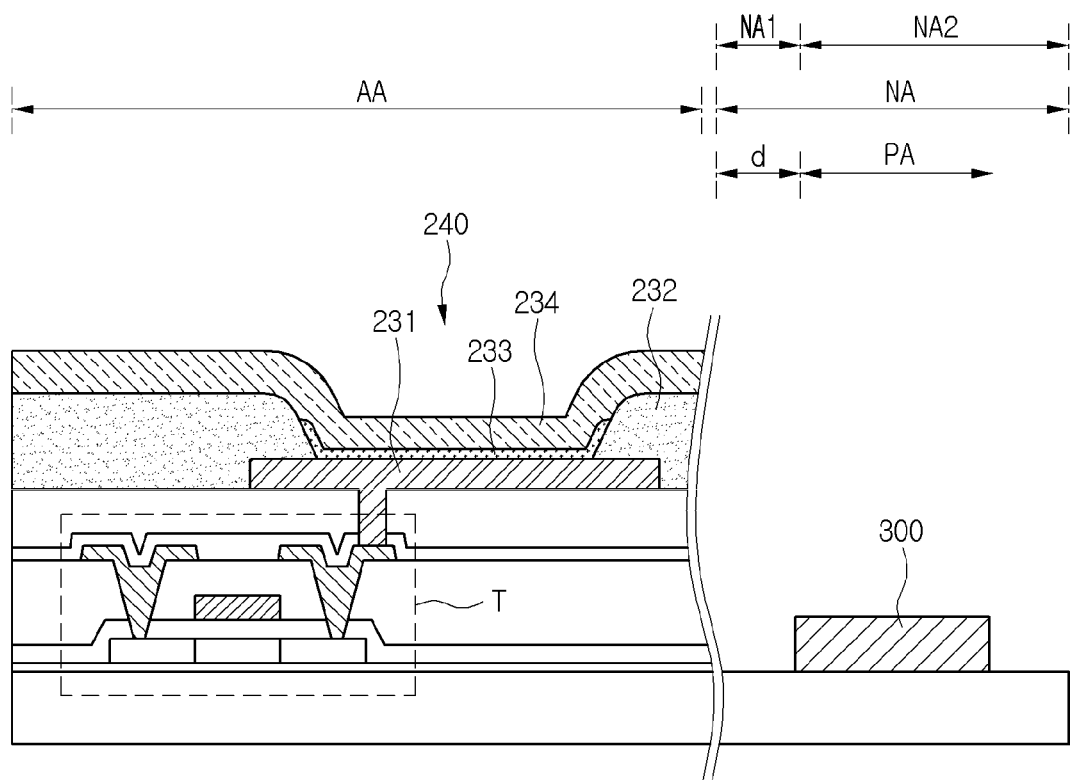

As shown in FIG. 3D, an organic light emission layer 233 is formed on the first electrode 231 which is exposed through the opening of the organic bank film 232. Subsequently, a second electrode 234 covering the entire display area AA is formed.

The organic light emission layer 233 can include a light emission layer EML, an electron transport layer ETL and an electric-hole transport layer HTL. The light emission layer EML forms excitons through re-combination of electrons and electric-holes and emits light through transition of the excitons. The electron transport layer ETL properly controls a drift speed of the electrons. The electric-hole transport layer HTL properly controls a drift speed of the electric-holes. The organic light emission layer 233 can further include an electron injection layer EIL formed on the electron transport layer ETL and an electric-hole injection layer HIL formed on the electric-hole transport layer HTL. The electron injection layer EIL enhances an injection efficiency of the electrons. The electric-hole injection layer HIL enhances an injection efficiency of the electric-holes.

If the second electrode 234 is used as a cathode, the second electrode 234 can be formed from any one selected from a metal group which consists of Al, an alloy of Mg and Ag, an alloy of Mg and Ca and so on. However, the second electrode 234 is not limited to the above-mentioned metal materials.

In this way, the light emission portion 240 is completed through the sequential formation of the first electrode 231, the organic light emission layer 233 and the second electrode 234.

When a voltage is applied between the first electrode 231 and the second electrode 234, the electrons generated in the second electrode 234 and the electric-holes generated in the first electrode 231 are drifted toward the organic light emission layer 233. As such, the excitons are generated within the organic light emission layer 233 through the re-combination of the applied electrons and electric-holes and the excitons are transitioned from an excited state to a ground state. As a result, light is generated in the organic light emission layer 233. The above-mentioned light emission phenomenon can be explained when the first electrode 231 is used as an anode and the second electrode 234 is used as a cathode, as a general case.

Figure 3E:
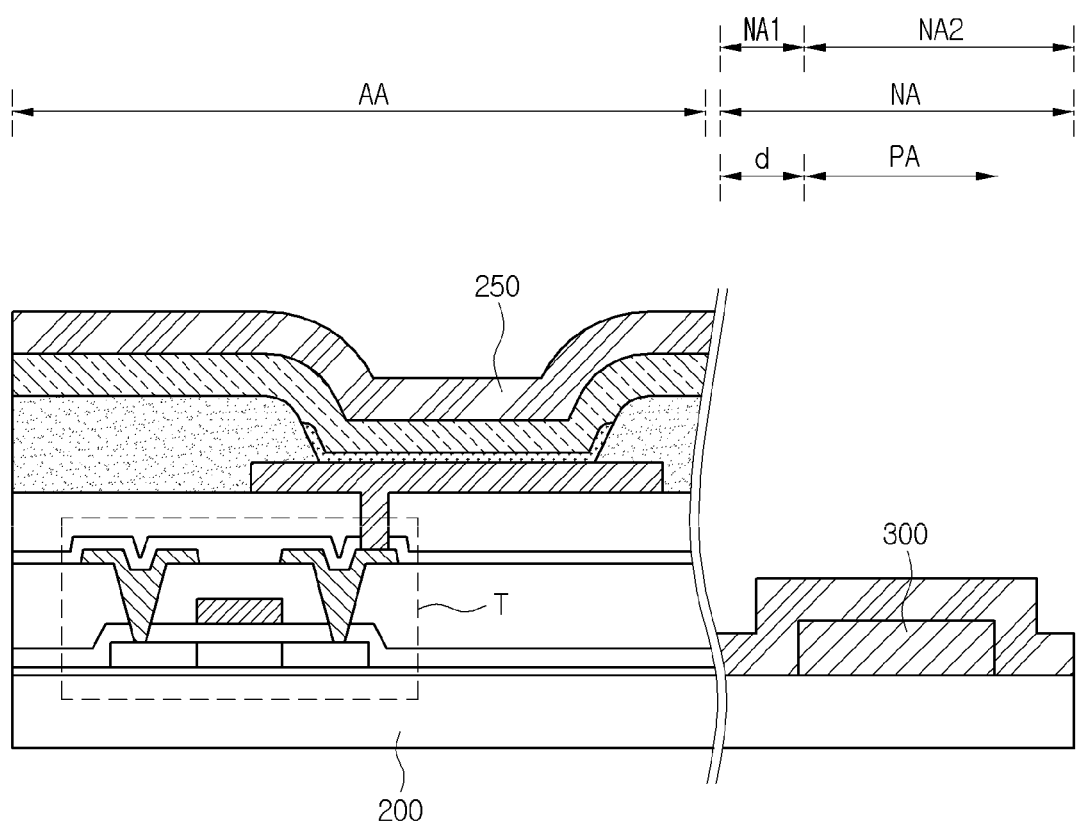

Referring to FIG. 3E, a sacrificial layer 250 for a laser exfoliation procedure is formed over the entire surface of the first substrate 200 which includes the display area AA and the non-display area NA provided with the pad area PA, after the light emission portion 240 is formed in the display area AA. Thus, the sacrificial layer 250 covers the entire surface of the display area AA and (at this stage) also the entire surface of the non-display area NA (including the first non-display area portion NA1 and the second non-display area portion NA3, thus also including the pad portion 300). To this end, a chemical vapor deposition (CVD) method or a physical vapor deposition (PVD) method can be used. The sacrificial layer 250 is used for a laser exfoliation procedure as will be described in more detail further below. In other words, the sacrificial layer 250 allows a removal procedure of an encapsulation passivation film 260 (shown in FIG. 3G) using a laser light to be easily performed later.

Preferably, the sacrificial layer 250 is formed in a thickness range of about 10-500 nm. If the sacrificial layer 250 is very thin, a laser absorption rate of the sacrificial layer 250 deteriorates and interfacial separation between the sacrificial layer 250 and the pad portion 300 cannot be completely achieved or performed. Moreover, laser light permeating through the sacrificial layer 250 can affect elements.

The sacrificial layer 250 can be formed from one of amorphous silicon a-Si, zinc oxide ZnO, tin oxide SnO2 and so on. If the sacrificial layer 250 is formed from amorphous silicon a-Si, green laser light with a wavelength of about 532 nm can be used in the laser exfoliation procedure. When the sacrificial layer 250 is formed from one of zinc oxide ZnO and tin oxide $SnO_2$, IR (infrared) laser light with a wavelength bend of about 710-1550 nm can be used in the laser exfoliation procedure.

Figure 3F:
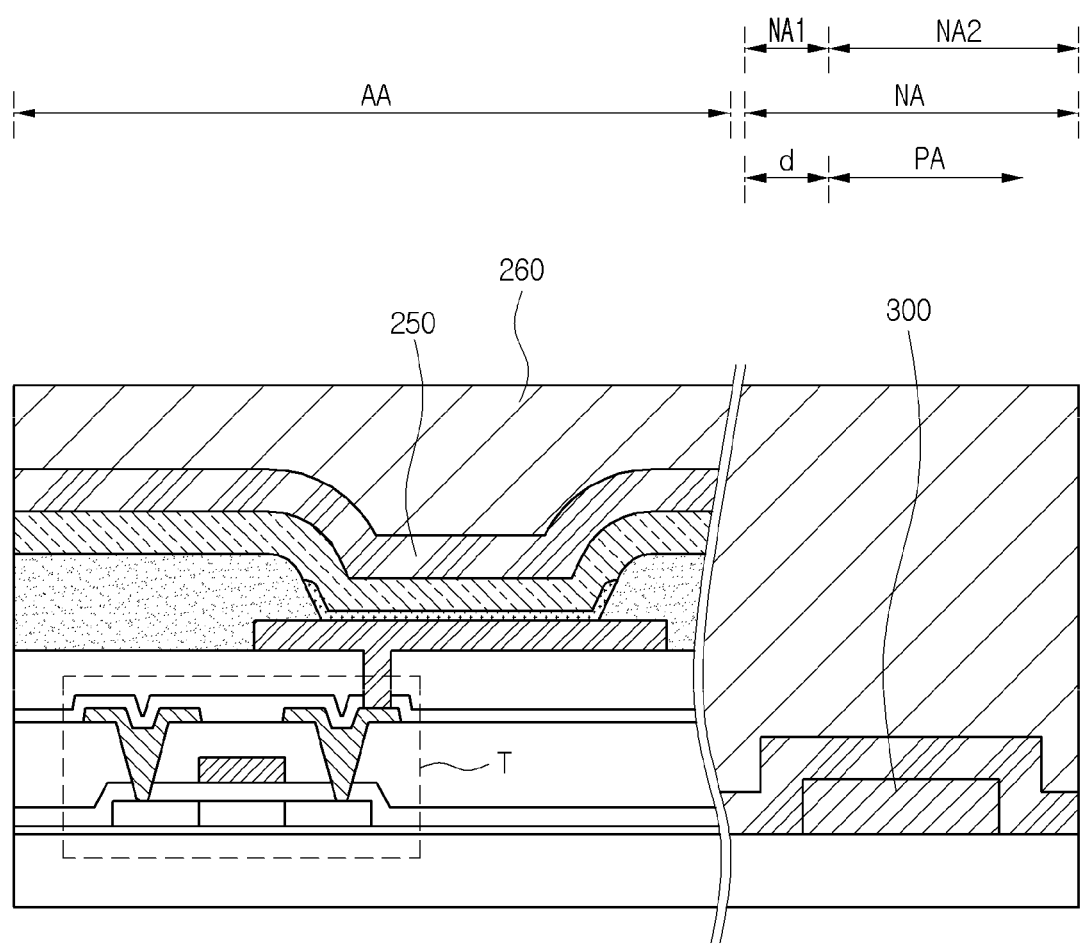

Afterward, in FIG. 3F, an encapsulation passivation film 260 is formed on the entire surface of the first substrate 200 which includes the display area AA and the non-display area NA provided with the pad area PA, as shown in FIG. 3F. The encapsulation passivation film 260 can be formed using one of a chemical vapor deposition (CVD) method, a spin coating method, a heat deposition method, an ink-jet printing method, a sputtering method and so on. When the encapsulation passivation film 260 is formed by the CVD method, any mask is not used. For example, the encapsulation passivation film 260 can be formed by depositing silicon nitride $Si_3N_4$, silicon dioxide $SiO_2$, or others on the entire surface of the first substrate 200, which includes the display area AA and the non-display area NA provided with the pad area PA, in a thickness of about 200 nm.

Figure 3G:
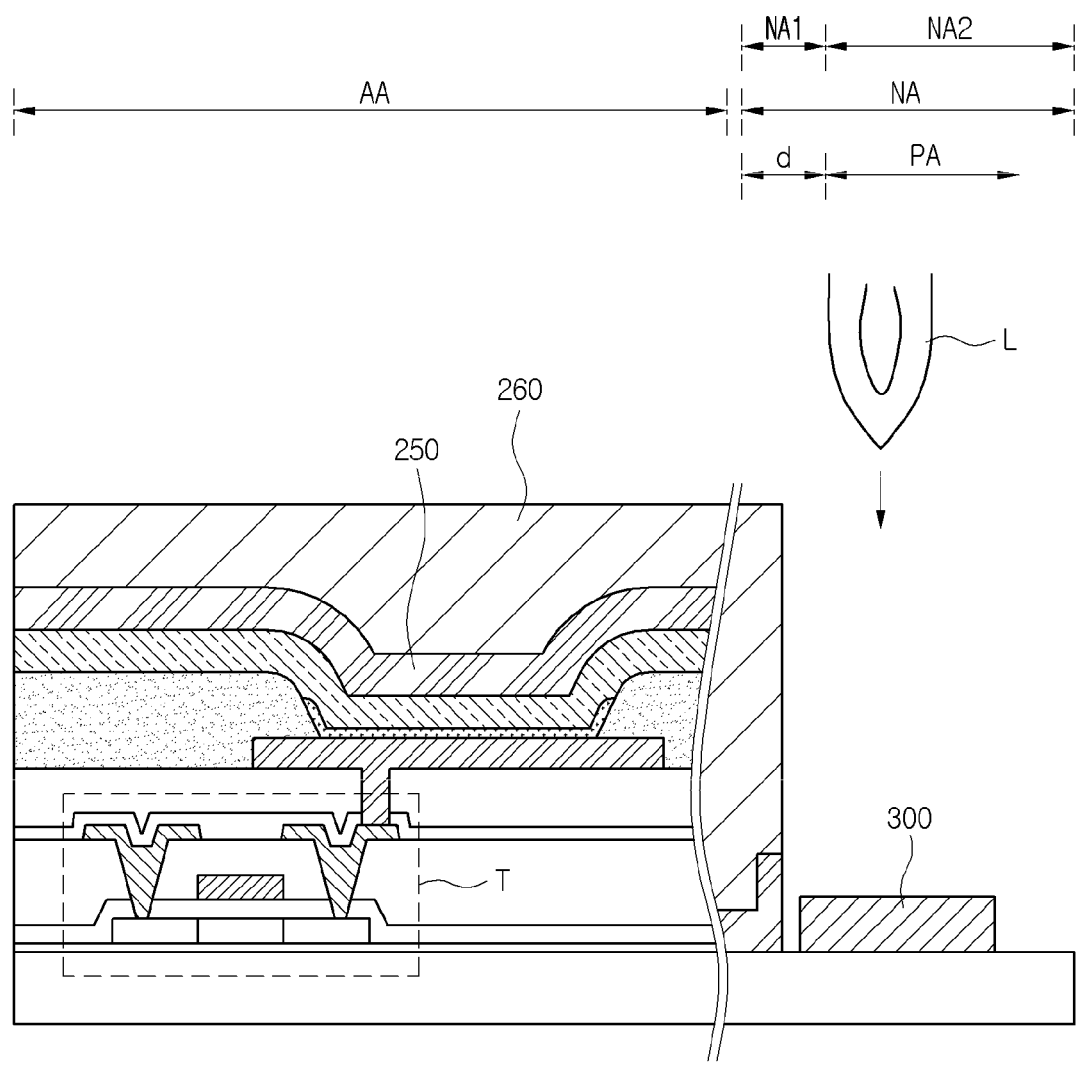

Subsequently, laser light is irradiated as shown in FIG. 3G, in order to remove the encapsulation passivation film 260 over the pad portion 300. Preferably, the irradiated laser light permeates through the encapsulation passivation film 260 and is absorbed into the sacrificial layer 250. As such, the encapsulation passivation film 260 is formed from a material with a high laser transmittance (e.g. $Si_3N_4$, $SiO_2$), e.g. about 98% of the irradiated laser light may be transmitted, e.g. for a laser light having a wavelength of 532 nm. However, it should be mentioned that the transmittance of the encapsulation passivation film 260 is independent from the used wavelength of the laser light. The sacrificial layer 250 is formed from a material with a high laser absorption rate. In various embodiments, the laser light may be focused into the sacrificial layer 250 in order to provide a high energy transfer and thus heat transfer into the sacrificial layer 250. Also, laser light smaller than band gap energy of the encapsulation passivation film 260 but larger than band gap energy of the sacrificial layer 250 can be selected. In various embodiments, the sacrificial layer 250 is thinner than the encapsulation passivation film 260. By way of example, the encapsulation passivation film 260 may have a thickness in the range from about 500 nm to about 2 μm, e.g. a thickness in the range from about 750 nm to about 1.5 μm, e.g. a thickness of about 1 μm. Furthermore, the sacrificial layer 250 may have a thickness in the range from about 25 nm to about 75 nm, e.g. in the range from about 35 nm to about 65 nm, e.g. a thickness of about 50 nm. When the material of the sacrificial layer 250 becomes gaseous, the volume of the sacrificial layer 250 is extended and thus a pressure is generated to separate the encapsulation passivation film 260 in the pad area.

The sacrificial layer 250 absorbing the laser light L expands in volume. In accordance therewith, the sacrificial layer 250 on the pad portion 300 together with the encapsulation passivation film 260 can be separated from the pad portion 300. In detail, due to the absorption of the laser light L, a surface temperature of the sacrificial layer 250 rises in an instant (or moment) and a surface phase of the sacrificial layer 250 changes. In other words, the surface portion of the sacrificial layer 250 changes from a solid phase into a gas phase through a liquid phase. The liquid phase is maintained during a very short period. Consequently, it is explained that the surface portion of the sacrificial layer 250 changes from the solid phase into the gas phase. The phase change of the surface portion of the sacrificial layer 250 into the gas phase allows a part of the surface portion of the sacrificial layer 250 to be gasified and removed. In accordance therewith, the sacrificial layer 250 and the encapsulation passivation film 260 can be separated from the pad portion 300. As described above, the pad area PA in the second non-display area portion NA2 is arranged at least at the distance d from the display area AA. The distance d is selected such that it is sufficiently large to ensure that cracks of the encapsulation passivation film 260 of the non-display area (in particular of the first non-display area portion NA1 do not extend into the portion of the encapsulation passivation film 260 of the display area AA.

In another way, a process of forming an adhesive layer (not shown) can be added between the formation process of the sacrificial layer 250 and the formation process of the encapsulation passivation film 260. The adhesive layer forces the sacrificial layer 250 to be separated together with the encapsulation passivation film 260 when the encapsulation passivation film 260 is separated.

Figure 3H:
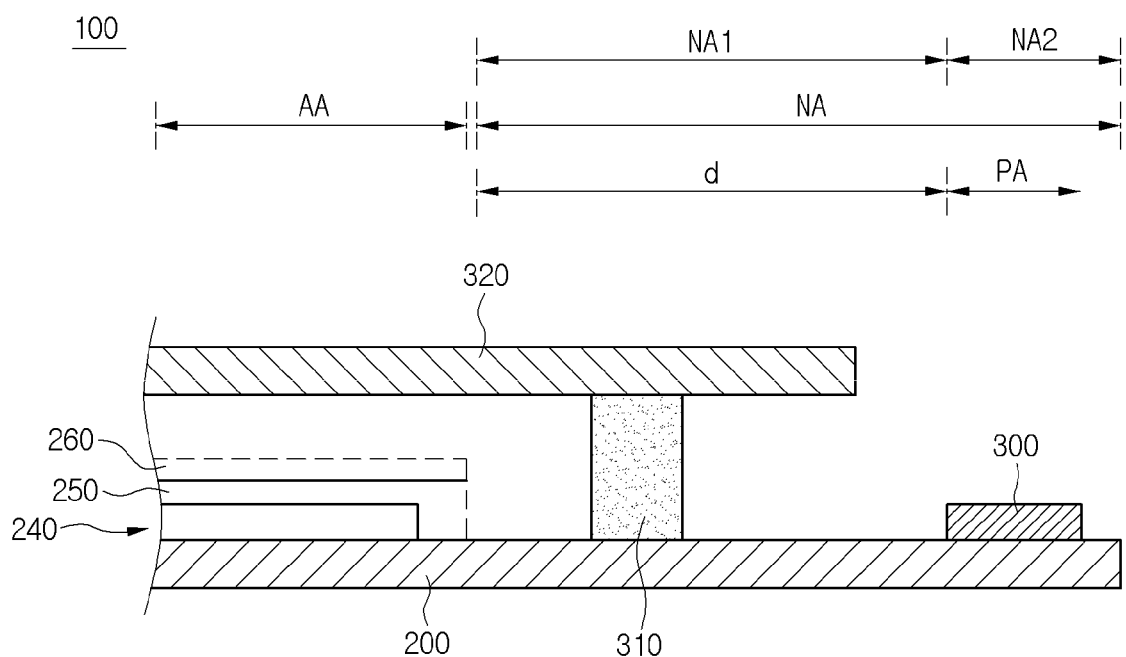

Referring to FIG. 3H, a second substrate 320 is combined with the first substrate 200 which is provided with the encapsulation passivation film 260. In other words, the second substrate 320 and the first substrate 200 are assembled and fixed together. The first and second substrates 200 and 320 are combined with each other by a sealing material 310. In accordance therewith, an organic light emitting diode device in accordance with the present disclosure is completed.

In detail, the first substrate 200 includes the light emission portion 240, the sacrificial layer 250 and the encapsulation passivation film 260, which are formed in the display area AA. Also, the first substrate 200 includes the pad portion 300 formed in the pad area PA of the non-display area NA.

An edge portion of the second substrate 320 facing the first substrate 200 is removed through a cutting process. The cutting process is performed in order to externally expose the pad portion 300 on the first substrate 200. Also, a driver IC (Integrated circuit) chips, a flexible printed circuit (FPC) board or others is electrically connected to the pad portion 300 through the following process.

In the manner, the present invention can realize a narrow bezel. As such, the present invention can secure design competitiveness of the organic light emitting diode device.

Also, the present invention can omit a CVD mask procedure. In accordance therewith, the present invention can reduce fabricating cost of the organic light emitting diode device.

It is to be noted that the sacrificial layer 250 may be formed with such a thickness with respect to the encapsulation passivation film 260 that a constructive interference of the light to be emitted may result in the encapsulation passivation film 260 due to sacrificial layer 250. This may be particular advantageous in the case of a top emitter organic light emitting diode device.

Furthermore, an increase of the transmittance of the sacrificial layer 250 and the encapsulation passivation film 260 with respect to blue light may be achieved. This may be advantageous to overcompensate for brightness of blue color light portion and may make it possible to reduce the size of a respective blue subpixel, in particular in the field of an OLED.

Moreover, it is to be noted that neither bank material nor cathode material is formed in the pad area PA: these materials are only formed in the display area AA.

Although the present disclosure has been limitedly explained regarding only the embodiments described above, it should be understood by the ordinary skilled person in the art that the present disclosure is not limited to these embodiments, but rather that various changes or modifications thereof are possible without departing from the spirit of the present disclosure. Accordingly, the scope of the present disclosure shall be determined only by the appended claims and their equivalents without being limited to the detailed description.

What is claimed is:

1. An organic light emitting diode device comprising:
   a substrate comprising a display area and a non-display area;
   a light emission portion in the display area of the substrate, the light emission portion including a first electrode, a light emitting layer on the first electrode, and a second electrode on the light emitting layer;
   a pad portion in the non-display area of the substrate;
   a sacrificial layer on the second electrode of the light emission portion; and
   an encapsulation passivation film over the sacrificial layer,
   wherein the pad portion does not contact the sacrificial layer and the encapsulation passivation film, and
   wherein the sacrificial layer has a higher absorption rate with respect to an irradiated laser light than the encapsulation passivation film.

2. The organic light emitting diode device of claim 1, wherein the encapsulation passivation film has a higher transmittance rate with respect to the irradiated laser light than the sacrificial layer.

3. The organic light emitting diode device of claim 1, wherein the encapsulation passivation film is in physical contact with the sacrificial layer.

4. The organic light emitting diode device of claim 1, wherein the light emission portion comprises an organic light emission layer.

5. The organic light emitting diode device of claim 1, wherein a thickness range of the sacrificial layer is 10-500 nm.

6. The organic light emitting diode device of claim 1, wherein the sacrificial layer includes at least one of amorphous silicon, zinc oxide and tin oxide as a material.

7. The organic light emitting diode device of claim 1, wherein the sacrificial layer has a thickness so as to provide a constructive interference of light generated by the light emission portion.

8. The organic light emitting diode device of claim 7, wherein the sacrificial layer has a thickness so as to provide a constructive interference of blue light generated by the light emission portion.

9. The organic light emitting diode device of claim 1, wherein a band gap energy of the encapsulation passivation film is larger than a band gap energy of the sacrificial layer.

10. The organic light emitting diode device of claim 1, further comprising an adhesive layer between the encapsulation passivation film and the sacrificial layer.

11. The organic light emitting diode device of claim 1, wherein the pad portion is electrically connected to one of a driver IC (Integrated circuit) chips and a flexible printed circuit (FPC) board.

12. The organic light emitting diode device of claim 1, further comprising an upper substrate facing the substrate, wherein the substrate and the upper substrate are combined with each other by a sealing material.

13. The organic light emitting diode device of claim 12, wherein the pad portion is externally exposed from the upper substrate.

14. An organic light emitting diode device comprising:
    a substrate comprising a display area and a non-display area;
    a light emission portion in the display area of the substrate;
    a pad portion in the non-display area of the substrate;
    a sacrificial layer over the light emission portion;
    an encapsulation passivation film over the sacrificial layer; and
    an adhesive layer between the encapsulation passivation film and the sacrificial layer,
    wherein the pad portion does not contact the sacrificial layer and the encapsulation passivation film, and
    wherein the sacrificial layer has a higher absorption rate with respect to an irradiated laser light than the encapsulation passivation film.

* * * * *